United States Patent [19]

Doi et al.

[11] 4,329,658

[45] May 11, 1982

[54] SEMICONDUCTOR LASER DEVICE

[75] Inventors: Atsutoshi Doi, Ohme; Kunio Aiki, Hachioji; Naoki Chinone, Hachioji; Satoshi Nakamura, Hachioji; Ryoichi Ito, Hachioji, all of Japan

[73] Assignee: Hitachi, Ltd., Tokyo, Japan

[21] Appl. No.: 51,144

[22] Filed: Jun. 22, 1979

[30] Foreign Application Priority Data

Jun. 30, 1978 [JP] Japan ............................ 53-78674

[51] Int. Cl.³ ............................................. H01S 3/19
[52] U.S. Cl. ........................................ 372/45; 372/46; 372/48
[58] Field of Search ................. 331/94.5 H; 357/17, 357/18

[56] References Cited

U.S. PATENT DOCUMENTS

| 3,883,821 | 5/1975 | Miller | 331/94.5 H |
| 3,978,428 | 8/1976 | Burnham et al. | 331/94.5 H |
| 4,033,796 | 7/1977 | Burnham et al. | 331/94.5 H X |
| 4,099,999 | 7/1978 | Burnham et al. | 331/94.5 H X |

FOREIGN PATENT DOCUMENTS

| 557 | 2/1979 | European Pat. Off. | 331/94.5 H |
| 2656532 | 7/1977 | Fed. Rep. of Germany | 331/94.5 H |

OTHER PUBLICATIONS

Kurada et al., "Channeled-Substrate-Planar Structure Distributed-Feedback Semiconductor Lasers", Appl. Phys. Lett. 33(2), Jul. 15, 1978, pp. 173-174.

Botez et al., "Channel Waveguide AlGaAs Edge Emitting LED, IBM", Technical Disclosure Bulletin, vol. 21, No. 3, Aug. 1978, p. 1260.

Tsang et al., "Lateral Current Confinement by Reverse-Biased Junctions in GaAs-Al$_x$Ga$_{1-x}$As DH Lasers", APL, vol. 30, No. 10, May 15, 1977, pp. 538-540.

*Primary Examiner*—James W. Davie
*Attorney, Agent, or Firm*—Craig and Antonelli

[57] ABSTRACT

A semiconductor laser device is formed of a semiconductor material assembly including a first semiconductor layer having an active region formed directly by crystal growth on a substrate for the crystal growth having on the surface thereof a second semiconductor layer. A third semiconductor layer is also formed on the first layer. The refractive index of each of the second semiconductor material region and the third semiconductor layer is smaller than that of the first semiconductor layer while the band gap of each of the second semiconductor material region and the third semiconductor layer is broader than that of the first semiconductor layer. In order to provide mode stabilization even at long wavelength, the thickness of the active region formed at the interface between said first semiconductor layer and said substrate for crystal growth is made larger than the thickness of the other portions in the first semiconductor layer so that the effective refractive index to laser beams is changed stepwise in a direction perpendicular to the direction of the laser beams.

11 Claims, 8 Drawing Figures

SEMICONDUCTOR LASER DEVICE

BACKGROUND OF THE INVENTION (1) Field of the Invention

The present invention relates to an injection type semiconductor laser device. More particularly, the invention relates to an injection type semiconductor laser device having a structure effective for stabilizing the lateral mode and a method for manufacturing the same.

(2) Description of the Prior Art

In injection type semiconductor laser devices, direct current oscillation at temperatures approximating room temperature has been made possible by adoption of a GaAs-Al$_x$Ga$_{1-x}$As double-hetero structure.

Recently, improvements of optical fibers have been advanced and optical fibers having a much reduced light transmission loss at a wave length of about 1 to about 1.3 μm have been developed. Accordingly, a semiconductor laser of this wave length region is very valuable as a light source for optical communication using such optical fibers.

Various proposals have heretofore been made in connection with stabilization of the transverse mode in injection type semiconductor laser devices. For example, there can be mentioned a structure published by Aiki et al. in Applied Physics Letters, Vol. 30, No. 12, pages 649-651 (1977). More specifically, there is proposed a semiconductor laser device having a double-hetero structure, which comprises a first semiconductor layer having a so-called active region and second and third semiconductor layers having a band gap larger than that of the first semiconductor layer, which are disposed on both the sides of the first semiconductor layer, respectively. In this semiconductor laser device, the thickness is changed stepwise in the second semiconductor layer and a fourth material layer having the complex refractive index changed with respect to laser beams is disposed at least on the outside of the thickness-reduced region of the second semiconductor layer. The transverse mode is stabilized by the effect of bleeding of laser beams in the fourth material region. Indeed, this proposal is effective for an injection type semiconductor laser device having a GaAs-Al$_x$Ga$_{1-x}$As double-hetero structure, but in case of a GaAs-Al$_x$Ga$_{1-x}$As type semiconductor laser device, long-wave length oscillation, especially at a wave length of 0.9 to 1.7 μm, is hardly possible theoretically. As the long-wavelength oscillation semiconductor laser device, there can be mentioned an InP-Ga$_x$In$_{1-x}$As$_y$P$_{1-y}$ type semiconductor laser device. If only the above-mentioned structure in which the thickness is changed stepwise in the second semiconductor layer is adopted for this semiconductor laser device, no sufficient stabilization of the lateral mode can be attained. The reason is that the InP layer fails to sufficiently absorb laser beams from the Ga$_x$In$_{1-x}$As$_y$P$_{1-y}$ layer as the active layer.

SUMMARY OF THE INVENTION

It is a primary object of the present invention to provide a semiconductor laser device effective for prolonging the oscillation wave length and stabilizing the transverse mode.

In accordance with the present invention, this object can be attained by an injection type semiconductor laser device having a double-hetero structure, which comprises a first semiconductor layer having an active region and a narrow band gap, a second semiconductor layer located below the first semiconductor layer and a third semiconductor layer located above the first semiconductor layer, said second and third semiconductor layers sandwiching the first semiconductor layer and each of said second and third semiconductor layers having a smaller refractive index and a broader band gap than the first semiconductor layer. Generally, the conducting type of the second semiconductor layer is reverse to that of the third semiconductor layer. The thickness of the active region of the first semiconductor layer is made larger on the side of the second semiconductor layer than in other portions to provide a region where the effective refractive index to laser beams is changed stepwise along the advance direction of laser beams and the direction perpendicular thereto. In the injection type semiconductor laser device of the present invention, the effective refractive index is changed stepwise along a direction perpendicular to the advance direction of laser beams and beams in the lateral direction are confined by the so formed optical guide passage, whereby the transverse mode is stabilized.

DETAILED DESCRIPTION OF THE PREFERRED EMBODIMENTS

The injection type semiconductor laser device of the present invention will now be described in detail by reference to a laser device of a GaInAsP-InP double-hetero structure as an example.

Figure 1:
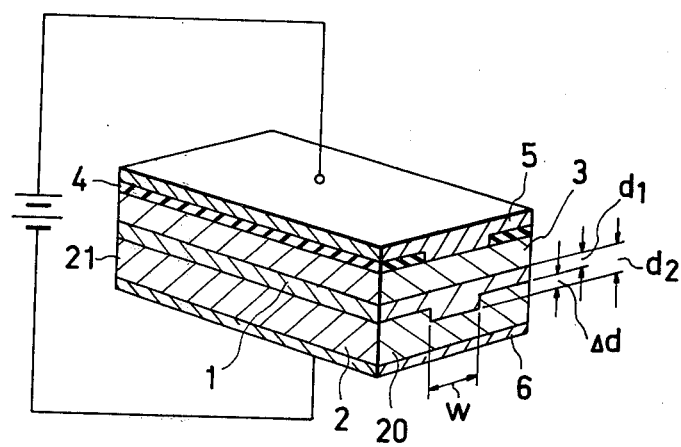
FIGS. 1, 4, 5 and 6 are perspective views showing examples of the structure of the injection type semiconductor laser device of the present invention.

A typical instance is illustrated in FIG. 1. A dent having a width of 7 μm is formed on an n-InP crystal substrate as the second semiconductor layer, and a layer of Ga$_x$In$_{1-x}$As$_y$P$_{1-y}$ (0.01 ≦ X ≦ 0.5 and 0.01 ≦ y < 1) as the first semiconductor layer is formed above the substrate. It is preferred that the top face of the first semiconductor layer be flat. Stepwise change of the effective refractive index to laser beams is brought about in the interface between the first semiconductor layer and the second semiconductor layer. The stepwise changed structure in the interface between the first semiconductor layer and the second semiconductor layer is set so that the following requirement is satisfied:

$$\frac{W}{H} \leq \frac{2\left(\frac{T}{H}\right)}{\sqrt{1-\left(\frac{T}{H}\right)^2}} \left(1 - \frac{1}{\pi}\frac{T}{H}\right) \quad (1)$$

In the case of the TE mode:

$$W = w \left[ 1 + \frac{n_1^2}{n_2^2} \frac{2}{v} \left( \frac{d_2}{w} \right) \right] \quad (2)$$

$$H = d_2 \left[ 1 + \frac{2}{v} \right] \quad (3)$$

$$T = d_1 \left[ 1 + \frac{2}{v} \left( \frac{d_2}{d_1} \right) \right] \quad (4)$$

In the case of the TM mode:

$$W = w \left[ 1 + \frac{2}{v} \left( \frac{d_2}{w} \right) \right] \quad (5)$$

$$H = d_2 \left[ 1 + \frac{n_1^2}{n_2^2} \frac{2}{v} \right] \quad (6)$$

$$T = d_1 \left[ 1 + \frac{n_1^2}{n_2^2} \frac{2}{v} \left( \frac{d_2}{d_1} \right) \right] \quad (7)$$

$$v = k d_1 (n_1^2 - n_2^2)^{\frac{1}{2}}$$

In the above formulae, w, $d_1$ and $d_2$ stand for the width of the thick portion of the first semiconductor layer, the thickness of the thin portion and the thickness of the thick portion, respectively, and $n_1$ and $n_2$ stand for the refractive indexes of the first semiconductor layer and the second semiconductor layer, respectively.

Generally, $d_1$ is about 0.2 to about 1 μm, preferably 0.2 to 0.5 μm. When $d_1$ is excessively large, the threshold current value is increased. The value of $\Delta d$ ($=d_2-d_1$) is set at 200 A to 0.1 μm, preferably 200 A to 0.5 μm. If the value is smaller than 200 A, it is impossible to obtain a refractive index difference sufficient to stabilize the transverse mode. Furthermore, w is set at about 2 to about 20 μm and is appropriately adjusted according to the required output and the like. A layer of $Ga_sIn_{1-s}As_tP_{1-t}$ (0.01≦s≦0.5 and 0.01≦t<1) is formed on this first semiconductor layer having the active region, whereby the double-hetero structure is constructed.

Naturally, the double-hetero structure can also be realized by using $Ga_xIn_{1-x}As_yP_{1-y}$ (0.01≦X≦0.5 and 0.01≦y<1) as the first semiconductor layer and $Ga_sIn_{1-s}As_tP_{1-t}$ (0.01≦X≦0.5, 0.01≦y<1 and y>t) as the second and third semiconductor layers. For example, there can be mentioned a structure comprising a second semiconductor layer of $Ga_{0.04}In_{0.96}As_{0.1}P_{0.9}$, a first semiconductor layer of $Ga_{0.3}In_{0.7}As_{0.7}P_{0.3}$ and a third semiconductor layer of $Ga_{0.04}In_{0.96}As_{0.1}P_{0.9}$. In this example, the band gap of the second and third semiconductor layers is 1.5 eV and the band gap of the first semiconductor layer is 0.91 eV.

In a semiconductor laser device having the above-mentioned structure, oscillation can be performed within a wave length region of 1.6 to 0.7 μm.

The present invention will now be described in detail by reference to the following Examples that by no means limit the scope of the invention.

EXAMPLE 1

An injection type semiconductor laser device having a structure as shown in FIG. 1 will now be described.

An $SiO_2$ film having a thickness of 0.3 μm is formed on an n-InP crystal substrate 2 having a thickness of 400 μm (carrier concentration $n = 2 \times 10^{18}$ cm$^{-3}$) by the chemical vapor deposition method (hereinafter referred to as "CVD method"). The $SiO_2$ film is removed in a depth of 0.08 μm in the form of a stripe having a width of 7 μm according to the photolithographic technique using an ordinary photoresist. The InP crystal substrate in the stripe portion is etched with the $SiO_2$ film being as the mask by using an etching solution of the $H_2SO_4$ type ($H_2SO_4/H_2O_2/H_2O = 5/1/1$). Then, the $SiO_2$ film is removed by hydrofluoric acid. Thus, a stripe dent is formed on the surface of the n-InP crystal substrate 2. Then, according to the known liquid phase epitaxial method, a layer 1 of $Ga_xIn_{1-x}As_yP_{1-y}$ and a layer 3 of p-InP (carrier concentration $p = 1 \times 10^{18}$ cm$^{-3}$) are grown on the surface of the n-InP crystal substrate 2. The layer 1 is grown so that the top face of the layer 1 is substantially flat.

When semiconductor layers are formed on the n-InP crystal substrate by the liquid phase epitaxy, in order to protect the n-InP substrate, it is preferred to adopt the following method.

More specifically, when InP or GaInAsP is grown on an InP crystal substrate by the liquid phase epitaxy, since InP is readily thermally decomposed, P is selectively evaporated from the surface of the InP crystal substrate, and the flatness is readily lost on the surface of the InP crystal substrate. In order to eliminte this disadvantage, a lid composed of a material capable of releasing P under heating, such as an InP crystal, is mounted above the InP crystal substrate before initiation of the epitaxial growth and the liquid phase epitaxial growth is carried out so that the surface condition of the InP crystal substrate is not substantially changed.

Figure 3:
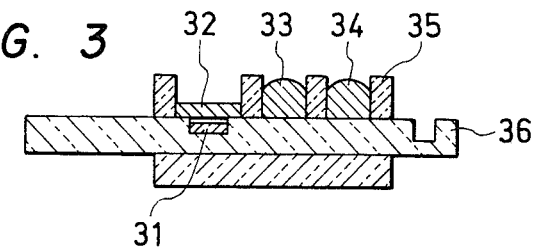
FIG. 3 is a sectional view illustrating an apparatus for use in the manufacture of the injection type semiconductor laser device of the present invention.

The basic principle of this method is illustrated in FIG. 3. Reference numeral 35 represents a solution receiver formed of graphite and reference numeral 36 represents a slide plate formed of graphite. Reference numeral 31 represents an n-InP crystal substrate and reference numeral 32 represents an InP crystal as a lid to be disposed above the n-InP crystal substrate to release P. Procedures are the same as in the known liquid phase epitaxial mwethod except that this lid is disposed. A first solution 33 is formed by dissolving 5 g of In, 25 mg of GaAs, 260 mg of InAs and 51 mg of InP under heating at 700° C. and then cooling the solution after dissolution of all the solutes. A second solution 34 is prepared by contacting 0.3 mg of Zn and 55 mg of InP with 5 g of In. The so arranged boat is heated at 650° C. for 30 minutes and is then cooled at a rate of 0.3° C. per minute. During the cooling, the slide plate 36 is moved to cause the n-InP crystal substrate 31 to fall in contact with the first solution and the second solution in sequence, whereby the GaInAsP layer 1 and p-InP layer 3 are grown. This method using the P-releasing lid is very simple and the method is very effective for the manufacture of the semiconductor laser device of the present invention. Instead of this method using the P-releasing lid, there may be considered a method comprising feeding a vapor of P but this method is not practical.

Formation of the layer 1 having a flat top face on the n-InP substrate having a dent can easily be accomplished according to the known liquid phase epitaxial method. Generally, according to the liquid epitaxial method, there is observed a tendency that convexities and concavities on the substrate are flattened and a flat growth is obtained. Accordingly, a layer having a flat top face can easily be realized according to the liquid phase epitaxial method. Specific compositions of GaInAsP layers of the so prepared semiconductor laser devices are illustrated in Table 1 together with other design factors.

Then, an $SiO_2$ film having a thickness of 3000 Å is formed according to the CVD method. According to the photolithographic technique using an ordinary photoresist, the $SiO_2$ film is selectively removed in the form of a stripe having a width of 10 μm, which corresponds to the dent of the n-InP substrate. A p-side electrode 5 of AuZn and an n-side electrode 6 of AuSn are formed by vacuum deposition. Examples of the so prepared semiconductor laser devices are shown in Table 1.

TABLE 1

| Wave length (μm) | Sample 1<br>1.15 | Sample 2<br>1.15 | Sample 3<br>1.30 | Sample 4<br>1.50 |
|---|---|---|---|---|
| first semiconductor layer | $Ga_{0.17}In_{0.83}$—$As_{0.4}P_{0.6}$ | $Ga_{0.17}In_{0.83}$—$As_{0.4}P_{0.6}$ | $Ga_{0.27}In_{0.73}$—$As_{0.62}P_{0.38}$ | $Ga_{0.38}In_{0.62}$—$As_{0.82}P_{0.18}$ |
| second semiconductor layer | n-InP | n-InP | n-InP | n-InP |
| third semiconductor layer | p-InP | p-InP | p-InP | p-InP |
| $d_1$ (μm) | 0.3 | 0.3 | 0.2 | 0.3 |
| $\Delta d$ (μm) | 0.06 | 0.06 | 0.04 | 0.06 |
| w (μm) | 14 | 7 | 8 | 7 |

Resonance reflection facets parallel to each other are formed on confronting end facets of the injection type semiconductor laser device shown in FIG. 1 by cleavage.

Figure 2:
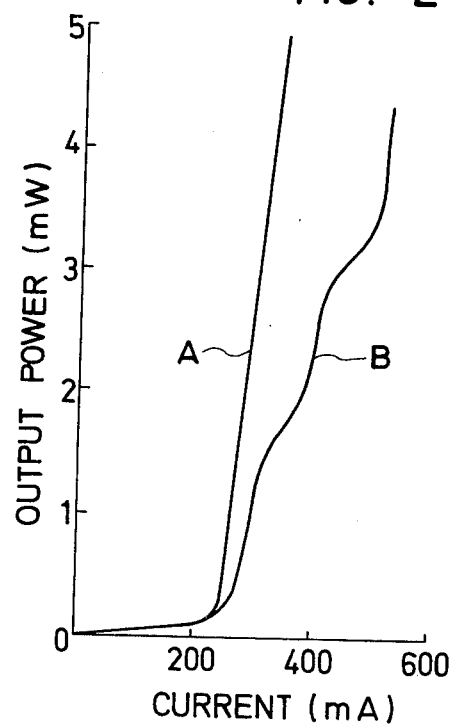
FIG. 2 is a diagram illustrating the reaction between the current and the laser beam output in the injection type semiconductor device of the present invention.

The characteristic diagram illustrating the relation between the injection current (mA) and the laser output (mW), which is observed when this semiconductor laser device is continuously operated at room temperature is shown in FIG. 2. Curve A illustrates the characteristics of the sample 2 shown in Table 1 and curve B illustrates the output characteristics of a comparative injection type semiconductor laser device illustrated in FIG. 1 where no stepwise change of the effective refractive index to laser beams is brought about in the first semiconductor layer but a simple double-hetero structure is merely formed. The characteristics shown by curve B indicate unstable mode and high-order mode inherent of a simple double-hetero structure.

A semiconductor laser device having a structure described below is also prepared.

Figure 4:
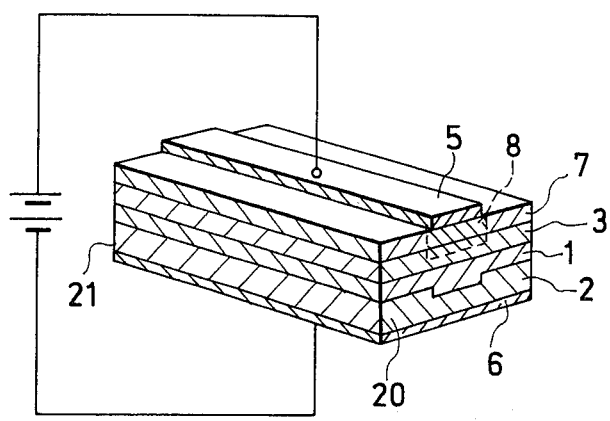

A stripe dent having a width of 8 μm is formed on an n-InP crystal substrate (carrier concentration $n = 2 \times 10^{18}$ cm$^{-3}$) according to the same method as described above. Then, as shown in FIG. 4, a layer 1 of $Ga_{0.21}In_{0.79}As_{0.48}P_{0.52}$ having a thickness of 0.3 μm ($d_1 = 0.3$ μm, $\Delta d = 0.1$ μm), a p-InP layer 3 having a thickness of 2 μm and an n-$Ga_{0.21}In_{0.79}As_{0.48}P_{0.52}$ layer 7 having a thickness of 1 μm are grown in sequence according to the liquid phase epitaxial method. Zn is diffused from the top face of the layer 7 to the p-InP layer 3 to form a diffusion region 8. A p-side ohmic electrode 5 composed of AuZn is formed above this region, and an AuSn layer is formed as an n-side electrode 6 on the lower face of the n-InP crystal substrate 2 by vacuum deposition. Resonance reflection facets parallel to each other are formed on the end facets 7 and 8 by cleavage. In this semiconductor laser device, oscillation is stably performed at an oscillation wave length of 1.2 μm as in the abovementioned semiconductor laser devices.

In the foregoing instances, the active layer 1 is sandwiched by InP crystals. The semiconductor layers contiguous to the active layer need not have the same composition. In the device shown in Example 3, compositions differ in the semiconductor layers contiguous to the active layer.

EXAMPLE 2

Figure 5:
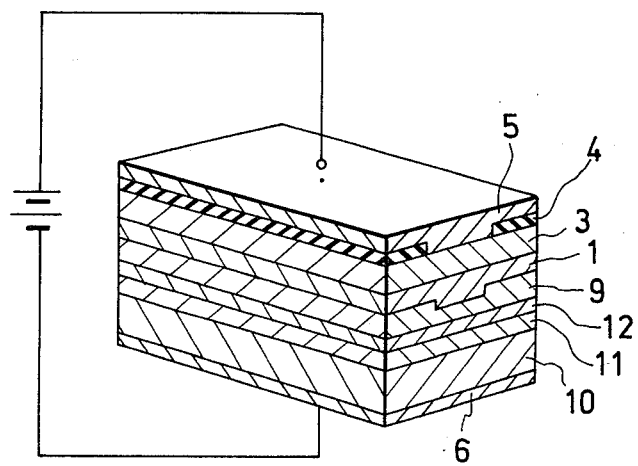

In the foregoing instances, an n-InP crystal substrate is used for a second semiconductor layer. In this Example, a multi-layer structure semiconductor layer is used for the substrate of a semiconductor laser device. This instance is illustrated in FIG. 5. A layer 11 of $GaAs_{1-y}P_y$ ($0 \leq y \leq 0.3$) as a grading layer is formed on a GaAs crystal substrate 10 according to the gas phase epitaxial method, and a layer 12 of $GaAs_{0.7}P_{0.3}$ having a thickness of about 50 μm is formed on the grading layer 11 according to the gas phase epitaxial method. Then, a layer 9 of n-$Ga_{0.66}In_{0.34}As_{0.01}P_{0.99}$ (Se-doped) having a thickness of 2 μm is formed on the layer 12 according to the liquid phase epitaxial method. According to the same method as described in Example 1, a stripe dent having a width of 2 μm and a depth of 0.2 μm is formed. Then, a layer 1 of $Ga_{0.77}In_{0.23}As_{0.21}P_{0.79}$ ($d_1 = 1$ μm, $\Delta d = 0.2$ μm) having a thickness of 1 μm and a layer 3 of p-$Ga_{0.66}In_{0.34}As_{0.01}P_{0.99}$ (Zn-doped) having a thickness of 2 μm are formed in sequence according to the liquid phase epitaxial method. Then, an $SiO_2$ film having a thickness of 3000 Å is formed according to the CVD method, and the $SiO_2$ film is selectively removed in a stripe region of 4 μm corresponding to the dent of the n-$Ga_{0.66}In_{0.34}As_{0.01}P_{0.99}$ layer 9. Then, an AuZn layer as a p-side electrode 5 and an AuSn layer as an n-side electrode 6 are formed. Parallel reflection facets are formed on the end facets of the crystal by cleavage. In the semiconductor laser device prepared in this Example, oscillation can be performed stably.

EXAMPLE 3

Figure 6:
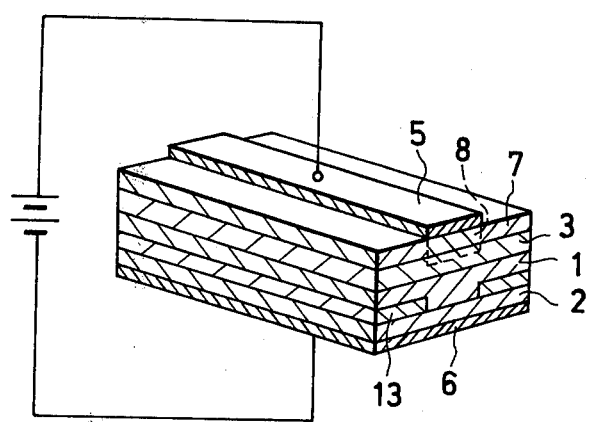

An instance illustrated in FIG. 6 will now be described.

A layer of $Ga_{0.02}In_{0.98}As_{0.06}P_{0.94}$ having a thickness of 0.1 μm is grown on an n-InP crystal substrate 2 according to the liquid phase epitaxial method. Then, according to the same method as described in Example 1, a mask of an $SiO_2$ film is formed. The layer 13 is selectively removed in the form of a stripe having a width of 5 μm by the above-mentioned $H_2SO_4$ type etching solution. Then, the mask for the selective etching is removed, and a layer 1 of $Ga_{0.17}In_{0.83}As_{0.4}P_{0.6}$ having a thickness of 0.3 μm, a p-InP layer 3 having a thickness of 2 μm and an n-$Ga_{0.17}In_{0.83}As_{0.4}P_{0.6}$ layer 7 having a thickness of 1 μm are grown according to the known continuous liquid phase epitaxial method. Then, a Zn-diffused region 8 formed by diffusing Zn from the top face of the layer 7. An AuZn layer as a p-side electrode 5 is formed in the upper portion of the region 8 and an AuSn layer as an n-side electrode 6 is formed on the lower face of the n-InP crystal substrate 2 by vacuum deposition. Parallel reflection facets are formed on the end facets of the crystal by cleavage. Although the layers 13 and 2 are present below the first semiconductor, the intended object of the present invention can be attained sufficiently.

In this Example, the layer 13 is completely removed in the stripe region. When the thickness of the layer 13 is large, the layer 13 need not be removed completely up to the substrate 2.

EXAMPLE 4

In the foregoing Examples, resonance reflection facets are formed by utilizing cleft end facets of the crystal. Of course, the present invention can be applied to a distributed feedback semiconductor laser device. This embodiment will now be described. Of course, various modifications may be made to the distributed feedback semiconductor laser device described below.

Figure 7:
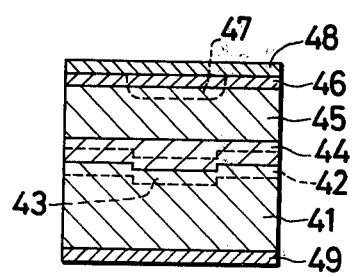
FIGS. 7 and 8 are sectional and side views showing the distributed feedback semiconductor laser device according to the present invention.
Figure 8:
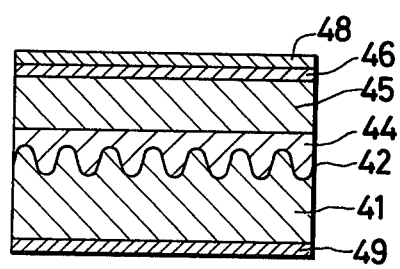

FIG. 7 is a view showing the section, vertical to the advance direction of laser beams, of the semiconductor laser device, and FIG. 8 is a side view of this semiconductor laser device.

An $SiO_2$ film is coated on an n-InP substrate 41 according to the CVD method, and a photoresist film is formed thereon. Interference stripes of laser beams are formed on the photoresist film by utilizing a laser device.

Periodic convexities and concavities 42 are formed on the substrate crystal by chemical etching using the diffraction lattice of the photoresist as a mask. A mixture of phosphoric acid/hydrogen peroxide solution-/ethylene glycol (mixing ratio=1/1/8) is used as the etching solution.

This method for forming periodic convexities and concavities is one disclosed in the specification of Japanese Patent Application No. 35579/75.

Then, an $SiO_2$ film is formed on the periodic convexities and concavities, and a band-like groove 43 having a width of 7 μm and a depth of 0.05 μm is formed in a direction at a right angle to the periodic convexities and concavities according to the conventional photoresist technique. Then, the $SiO_2$ film is removed and a layer 44 of $Ga_{0.17}In_{0.83}As_{0.4}P_{0.6}$ (having an average thickness of 0.3 μm), a layer 45 of p-InP (having a thickness of 2 μm) and a layer 46 of n-InP (having a thickness of 1 μm) are grown on the InP substrate having a band-like groove and periodic convexities and concavities crossing the groove at a right angle according to the continuous liquid phase epitaxial method. Then, an $SiO_2$ film is coated and a part of the crystal is selectively etched to expose separately formed convexities and concavities to the surface so that the film can be used as a matching mask at the photoresist step. A stripe having a width of 10 μm is formed above the band-like groove by etching of the $SiO_2$ film. Then, Zn is diffused at 650° C., by using the $SiO_2$ film as a mask to form a diffusion region 47. Then, a p-side electrode 48 of an AuZn alloy and an n-side electrode 49 of an alloy AuSn are formed. The so formed laminate structure is divided into chips to obtain semiconductor laser diodes.

The GaInAsP layer grows so that the convexities and concavities formed on the substrate are covered to provide a flat surface. However, because of the presence of such covered convexities and concavities, the thickness of the GaInAsP layer is changed. Accordingly, a rib wave guide is formed in the lateral direction and a diffraction lattice is formed in a direction crossing the rib wave guide at a right angle. Therefore, laser oscillation with stable lateral and longitudinal modes can be obtained.

In FIGS. 7 and 8, two dot lines in the vicinity of the interface between the layers 41 and 55 indicate the upper and lower limits of the periodic convexities and concavities formed in the interface of these layers.

What is claimed is:

1. A semiconductor laser device having a semiconductor material assembly for generating laser beams comprising:
    a first semiconductor layer providing an active region formed between lateral regions of said first layer adjacent to said active region thereof;
    a substrate for crystal growth, said substrate having on a surface thereof a second semiconductor region on which the first layer has been formed directly by crystal growth so that said first layer as in direct contact with said second semiconductor region;
    a third semiconductor layer formed on the first layer, the second region and the third layer having a smaller refractive index than the first layer and having a broader band gap than the first layer;
    a first electrode on the upper surface of said assembly;
    a second electrode on the lower surface of the said assembly; and
    means for providing optical feedback so as to generate said laser beams,
    wherein, in a cross-section of said semiconductor material assembly perpendicular to the direction of said laser beams, the first layer is thicker at the said active region than at said lateral portions of the first layer and projects at said active region into a stripe-shaped recess formed in said second region in a direction parallel to the direction of said laser beams so that the effective refractive index of said first layer to said laser beams varies stepwise across the assembly in a direction perpendicular to the direction of said laser beams.

2. A semiconductor laser device as set forth in claim 1 wherein the substrate for crystal growth has a multi-layer structure.

3. A semiconductor laser device as set forth in claim 1 wherein the substrate for crystal growth has a stripe-like concavity extending in a direction parallel to the advance direction of said laser beams and the first semiconductor layer is formed on said concavity, whereby said stepwise change of the refractive index to laser beams is caused.

4. A semiconductor laser device as set forth in claim 1 wherein said second region is a layer which has the recess formed therein.

5. A semiconductor laser device as set forth in claim 2, 3 or 1 wherein said first semiconductor layer is composed of $Ga_xIn_{1-x}As_yP_{1-y}$ in which x is in the range of $0 < x < 1$ and y is in the range of $0 < y < 1$, and said second semiconductor region and third semiconductor layer are composed of InP or $Ga_sIn_{1-s}As_tP_{1-t}$ in which s is in the range of $0 < s < 1$, t is in the range of $0 < t < 1$ and t is smaller than y.

6. A semiconductor laser device as set forth in claim 5 wherein the difference between the thickness of the active region of the first semiconductor layer and the thickness of the other portion is 200 A to 0.5 μm.

7. A semiconductor laser device as set forth in claim 5 wherein the difference between the thickness of the active region of the first semiconductor layer and the thickness of the other portion is 200 A to 0.1 μm.

8. A semiconductor laser device as set forth in claim 6 wherein the thickness of the first semiconductor layer in the portion other than the active region is 0.2 to 1 μm.

9. A semiconductor laser device as set forth in claim 1 wherein said means for performing optical feedback is means for utilizing reflections from end facets of said semiconductor material assembly.

10. A semiconductor laser device as set forth in claim 1 wherein said means for performing optical feedback is a diffraction lattice formed in said semiconductor material assembly.

11. A semiconductor laser device as set forth in claim 7 wherein the thickness of the first semiconductor layer in the portion other than the active region is 0.2 to 1 μm.

* * * * *